US009335798B1

(12) United States Patent
Lin (10) Patent No.: US 9,335,798 B1
(45) Date of Patent: May 10, 2016

(54) ASSEMBLY STRUCTURE FOR DATA STORAGE DEVICE OF SERVER

(71) Applicant: AIC INC., Taoyuan Hsien (TW)

(72) Inventor: Yu-Feng Lin, Taoyuan Hsien (TW)

(73) Assignee: AIC INC., Taoyuan Hsien (TW)

( * ) Notice: Subject to any disclaimer, the term of this patent is extended or adjusted under 35 U.S.C. 154(b) by 0 days.

(21) Appl. No.: 14/692,044

(22) Filed: Apr. 21, 2015

(51) Int. Cl.
| | | |
|---|---|---|
| G06F 1/16 | (2006.01) |
| H05K 5/00 | (2006.01) |
| H05K 7/16 | (2006.01) |
| A47B 81/00 | (2006.01) |
| A47F 7/00 | (2006.01) |
| G06F 1/18 | (2006.01) |
| H05K 7/14 | (2006.01) |
| H05K 7/18 | (2006.01) |

(52) U.S. Cl.
CPC .............. *G06F 1/187* (2013.01); *H05K 7/1489* (2013.01); *H05K 7/18* (2013.01)

(58) Field of Classification Search
CPC ...... G06F 1/187; G06F 1/181; G11B 33/0461
USPC .......................... 361/679.31–679.4, 724–727; 312/223.1, 223.2; 211/26
See application file for complete search history.

(56) References Cited

U.S. PATENT DOCUMENTS

| | | | | |
|---|---|---|---|---|
| 7,423,869 B2 * | 9/2008 | Su | ........................... | G06F 1/187 312/223.2 |
| 7,443,668 B2 * | 10/2008 | Hsu | ........................ | G11B 33/12 312/223.1 |
| 7,835,148 B2 * | 11/2010 | Tu | ........................... | G06F 1/187 206/701 |
| 8,118,271 B2 * | 2/2012 | Peng | ........................ | G06F 1/187 248/221.11 |
| 8,159,817 B2 * | 4/2012 | Lin | ........................ | F16C 29/02 312/223.1 |
| 8,243,435 B2 * | 8/2012 | Li | ........................ | G11B 33/124 312/223.2 |
| 2002/0172003 A1 * | 11/2002 | Bang | ........................ | G06F 1/181 361/679.58 |
| 2004/0066632 A1 * | 4/2004 | Fang | ........................ | G06F 1/187 361/727 |
| 2007/0205702 A1 * | 9/2007 | Hsu | ........................ | G11B 33/12 312/9.1 |
| 2009/0040711 A1 * | 2/2009 | Li | ........................... | G06F 1/187 361/679.33 |

* cited by examiner

*Primary Examiner* — Nidhi Thaker
(74) *Attorney, Agent, or Firm* — Chun-Ming Shih; HDLS IPR Services (57) ABSTRACT

An assembly structure for a data storage device of a server includes a tray (60), a frame (100), and a transverse movement member (200). The tray (60) has a guiding pillar (10). The frame (100) is disposed on the tray (60). The frame (100) includes a side wall (110) and a hook plate (112) disposed on a surface of the side plate (110). The transverse movement member (200) is connected to the hook plate (112) of the side plate (110) and is movable transversely. The transverse movement member (200) includes a guiding slot (220) movable with respect to the guiding pillar (10) and includes a restriction recess (230) restricting the hook plate (112) from moving transversely. Accordingly, this simple structure can achieve handy operation, and allows quick assembly and disassembly of the data storage device without the use of any tool.

8 Claims, 10 Drawing Sheets

ASSEMBLY STRUCTURE FOR DATA STORAGE DEVICE OF SERVER

BACKGROUND

1. Technical Field

The present invention relates to an assembly structure and, in particular, to an assembly structure which allows quick assembly and disassembly of a data storage device of a server without the use of any tool.

2. Related Art

Industrial computer servers usually utilize removable hard disks to facilitate replacement or maintenance of the hard disks. Generally, the removable hard disks are fixed on the chassis in the server by screw fixation. However, in the screw fixation method, screws have to be fastened one by one by use of a screw driver or similar tools by manpower. When removing the hard disk from the server to replace the hard disk, the screws have to be unfastened by use of the screw driver or the like to remove the hard disk. Therefore, it is time and labor consuming to install or replace the hard disk, thereby resulting in low efficiency.

Furthermore, in another conventional technique, a pull handle is disposed on a panel of a removable hard disk cartridge. The pull handle includes a hook and a push portion. The hook can hook a contact pillar of the panel, whereby the pull handle is secured on the contact pillar and does not sway in its folding mode. When replacing the hard disk in the removable hard disk cartridge, by rotating the pull handle on the panel of the removable hard disk cartridge, the push portion pushes against a server chassis to whereby remove the removable hard disk cartridge and the hard disk out of the server chassis to facilitate replacement of the hard disk. However, rotation of the pull handle requires sufficient room for operation, and consequently, the sizes of the server chassis might have to increase.

In view of the foregoing, the inventor made various studies to improve the above-mentioned problems, on the basis of which the present invention is accomplished.

BRIEF SUMMARY

It is an objective of the present invention to provide an assembly structure for a data storage device of a server, which has a simple structure, achieves handy operation, and allows quick assembly and disassembly of the data storage device.

Accordingly, the present invention provides an assembly structure for a data storage device of a server, which comprises a tray, a frame, and a transverse movement member. The tray has a guiding pillar. The frame is disposed on the tray. The frame includes a side wall and a hook plate vertically disposed on a surface of the side plate. The transverse movement member is connected to the hook plate of the side plate and is movable in a transverse direction. The transverse movement member includes a guiding slot movable with respect to the guiding pillar and moving the frame in a longitudinal direction. The transverse movement member also includes a restriction recess restricting the hook plate from moving transversely.

The present invention also has the following effects. According to the "resolution of force" principle, when the transverse movement member is moved transversely, the guiding pillar generates to the inclined slot a longitudinal force component perpendicular to the transverse direction, whereby the transverse movement member generates a longitudinal pulling or pushing force with respect to the guiding pillar. Thus, the user only needs to operate the transverse movement member along the transverse direction to move the frame (i.e. the data storage device) longitudinally, thereby achieving quick replacement or maintenance of the disk without the use of any tool. Furthermore, by collaboration of the transverse movement member and the frame, the present invention has a simple structure and achieves handy operation, reduces the size of the server chassis, and reduces the manpower cost or a waste of other costs.

DETAILED DESCRIPTION

The present invention provides an assembly structure which enables pulling out a frame or installing a data storage device by transversely moving a transverse movement member. The data storage device is preferably a 3.5-inch hard disk, a 2.5-inch hard disk, a 1.8-inch hard disk, or any other suitable sizes of hard disk. The types of the hard disks include a hard disk drive (HDD), a solid state drive (SSD), and any hot-swappable storage device; however, the present invention is not limited thereto. In the following, detailed descriptions along with accompanied drawings are given to better explain the features and technical contents of the present invention. However, the following descriptions and the accompanied drawings are for reference and illustration only, and are not intended to limit the scope of the present invention.

Figure 1:
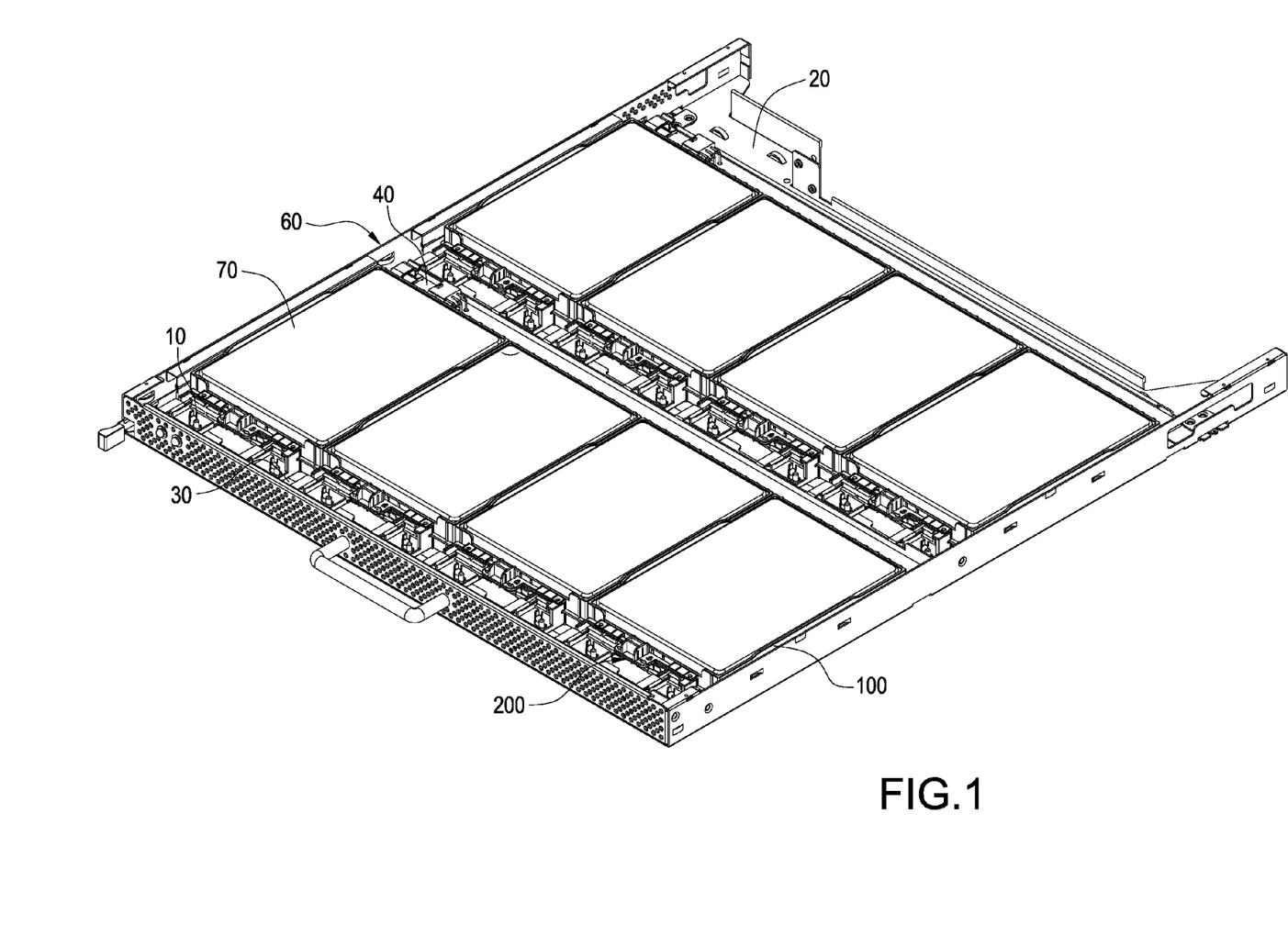
FIG. 1 is a perspective view of the present invention, illustrating data storage devices installed on a tray of a server.
Figure 2:
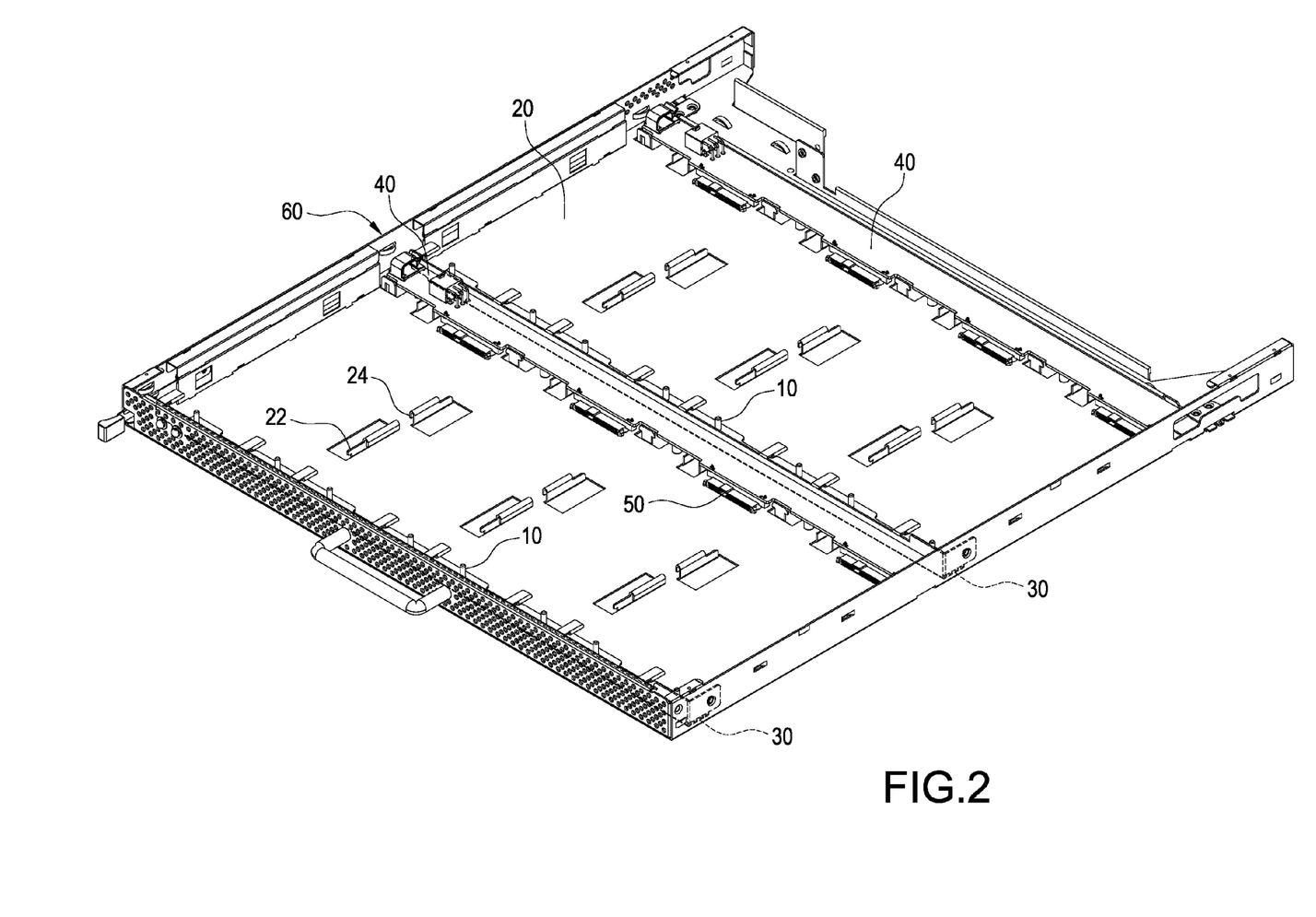
FIG. 2 is a perspective view of the present invention, illustrating a tray (with frames omitted for clarity) of a server.

Referring to FIGS. 1 and 2, the present invention provides an assembly structure for a data storage device, which comprises a tray 60, a frame 100, and a transverse movement member 200. It is preferable that a plurality of frames 100 and transverse movement members 200 corresponding thereto are disposed in the tray 60. Moreover, in the embodiment shown in FIGS. 1 and 2, the tray 60 preferably refers to one server chassis in the server, and the height of the tray is measured in U, where 1 U is 1.75 inches or 44.45 mm, wherein there are at least two rows of the data storage devices 70 disposed on the tray 60. In the present embodiment, only one frame 100 and only one transverse movement member 200 are described to exemplify the present invention.

Figure 3:
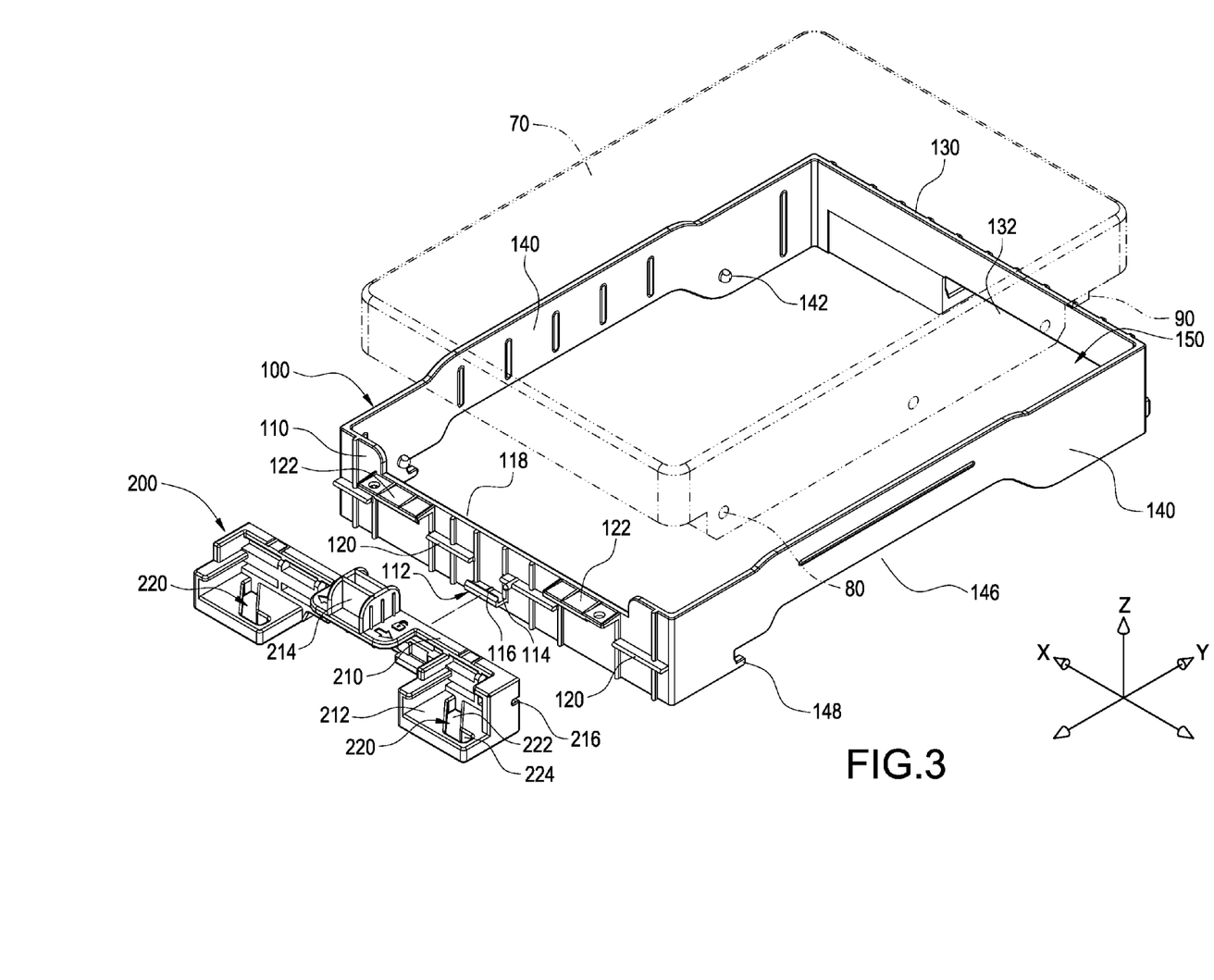
FIG. 3 is an exploded view illustrating one assembly structure according to the present invention.
Figure 4:
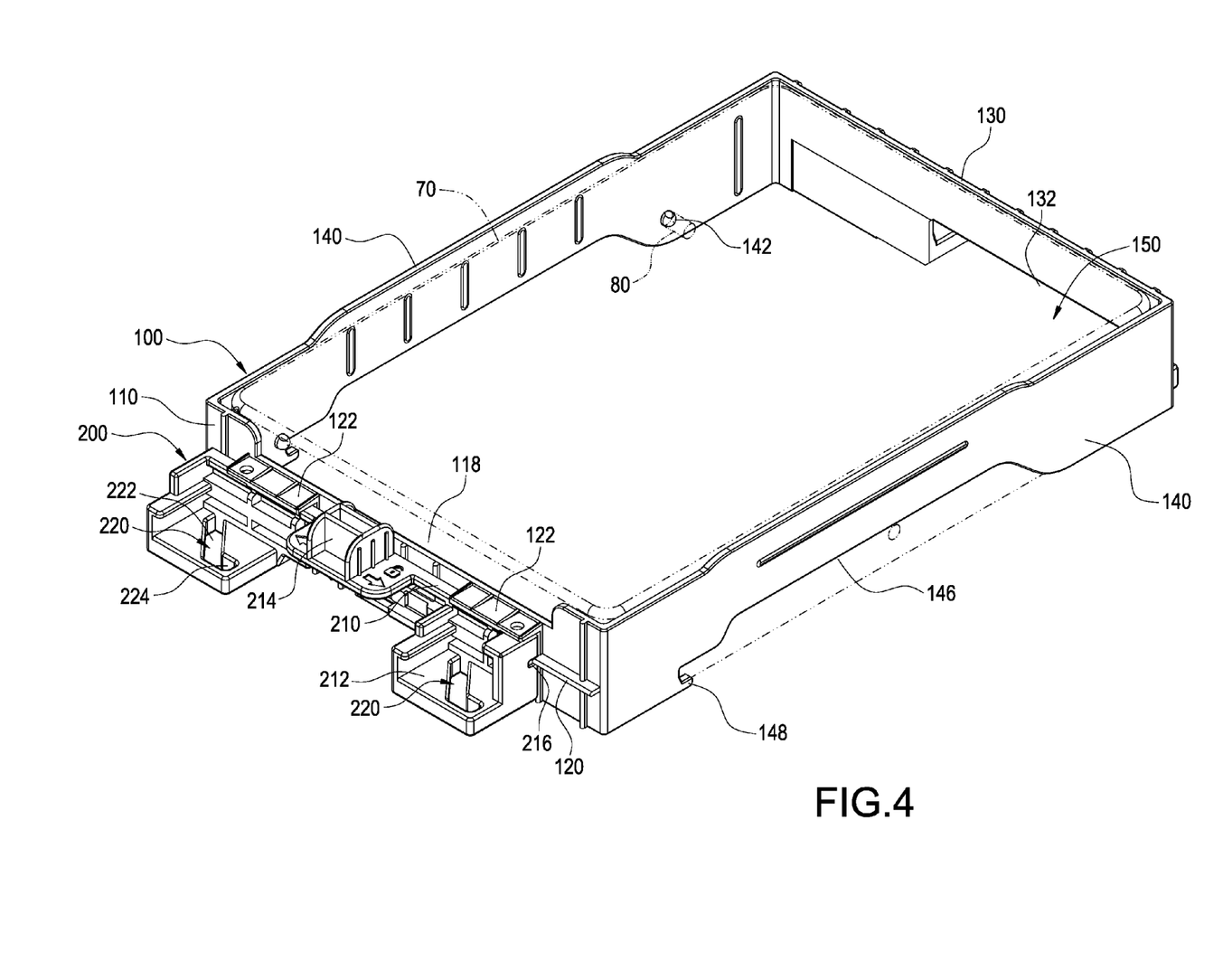
FIG. 4 is an assembled view of the assembly structure shown in FIG. 3.

Referring to FIGS. 3 and 4, the frame 100 is disposed on the tray 60 and is movable along a longitudinal direction Y. The frame 100 includes a side wall 110 and a hook plate 112 vertically disposed on a surface of the side plate 110. The transverse movement member 200 is connected to the hook plate 112 of the side plate 110 and is movable in a transverse direction X. The transverse movement member 200 includes a guiding slot 220 movable with respect to the guiding pillar (not illustrated) and moving the frame 100 in a longitudinal direction Y. The transverse movement member 200 also includes a restriction recess 230 restricting the hook plate 112 from moving transversely. According to the embodiment shown in FIGS. 3 and 4, the frame 100 further includes a second side plate 130 corresponding to the side plate 110, two third side plates 140 connected to the side plate 110 and the second side plate 130, and an accommodation room 150 surrounded by the side plate 110, the second side plate 130, and the two third side plates 140. The accommodation room 150 is provided for accommodating a data storage device 70. The auxiliary plate 120, the restriction plate 122, and the hook plate 112 are disposed parallel to one another, and the auxiliary plate 120 is preferably disposed between the hook plate 112 and the restriction plate 122.

Figure 5:
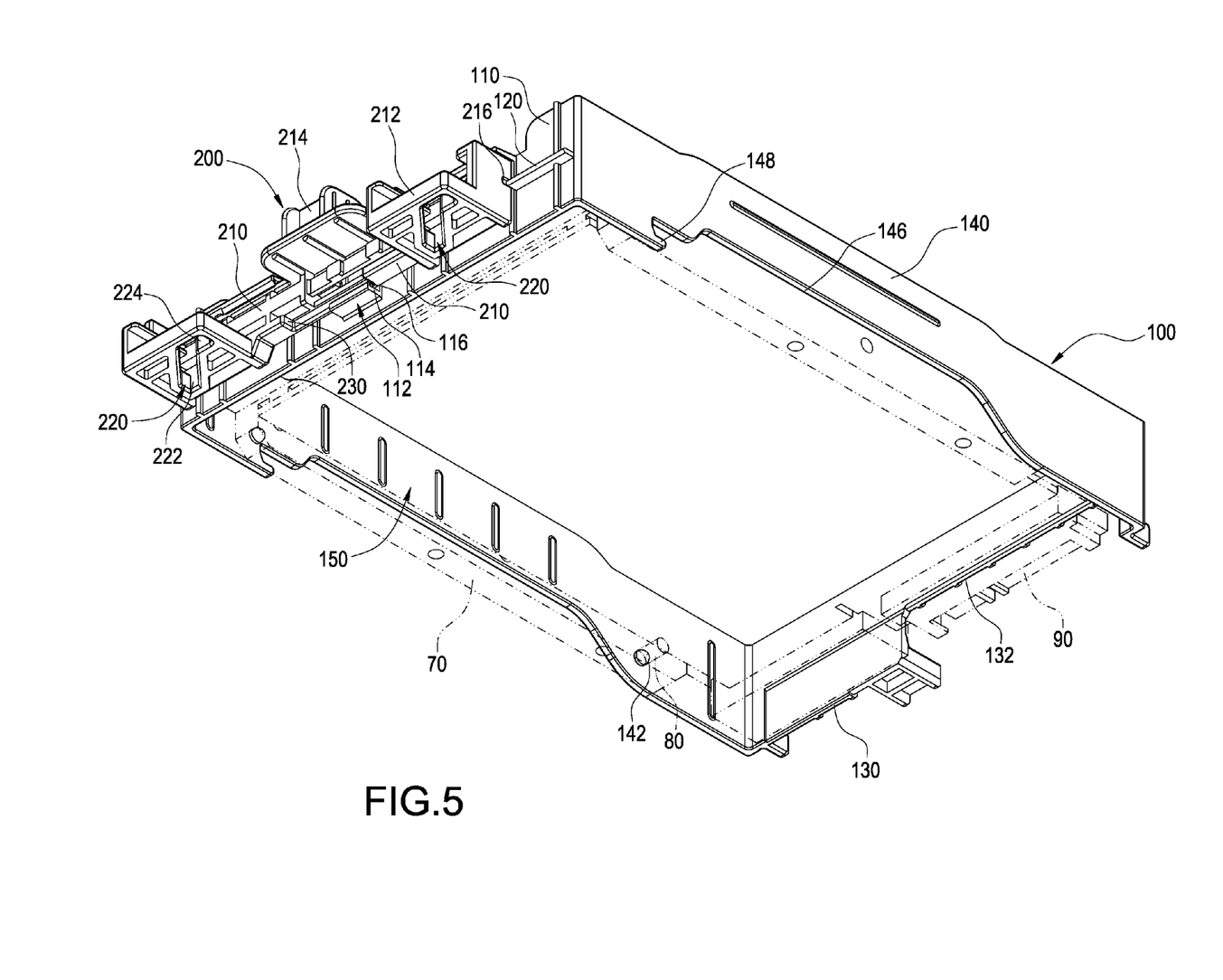
FIG. 5 is another assembled view of the assembly structure shown in FIG. 3, viewed from a different viewing angle.

Referring to FIG. 5, the transverse movement member 200 further includes a body 210, an extension portion 212 forming the guiding slot 220, an actuation portion 214, and an auxiliary recess 216. It is preferable that the actuation portion 214 is protrudingly disposed on an upper surface of the body 210 so as to facilitate operations for users. The extension portion 212 extends outwardly from the body 210 away from the hook plate 112, and the extension portion 212 is preferably disposed at two ends of the body 210. According to the present embodiment, the transverse movement member 200 preferably includes two guiding slots 220, and consequently, preferably includes two guiding pillars (not illustrated), whereby the data storage device 70 can move longitudinally in a stable manner. Furthermore, the guiding slot 220 moves with respect to the guiding pillar (not illustrated) can be a through slot or a blind slot so as to be inserted or guided by the guiding pillar, depending on requirement. The restriction recess 230 is formed on an opposite side of the body 210 with respect to the actuation portion 214 for limiting a transverse movement distance of the transverse movement member 200. The hook plate 112 includes a flat plate 114 and a hook portion 116 disposed at one end of the flat plate 114, and the hook portion 116 can hook a wall of the restriction recess 230.

Referring to FIG. 3, the side plate 110 further includes an auxiliary plate 120 disposed corresponding to the auxiliary recess 216 and includes a restriction plate 122 restricting the body 210 from moving in a vertical direction Z. The side plate 110 further includes a depression 118 adjacent to the restriction plate 122. It is preferable that the side plate 110 includes a plurality of auxiliary plates 120 and a plurality of restriction plates 122, and the auxiliary plates 120 and the restriction plates 122 are preferably integrally formed with the side plate 110 and are protrudingly disposed thereon. The depression 118 formed on an upper edge of the side plate 110 is adapted to facilitate removal of the data storage device 70 by users. Moreover, the second side plate 130 includes an assembly hole 132 disposed corresponding to a socket 90 of the data storage device 70.

Referring to FIG. 5, the assembly hole 132 is preferably provided for assembling an electrical connector 50 for insertion connection with the socket 90 of the data storage device 70. Furthermore, the two third side plates 140 further include a plurality of protruding points 142, an open recess 146, and a positioning hook 148 disposed at one side of the open recess 146. The protruding points 142 are disposed on an inner surface of the two third side plates 140. The protruding points 142 are disposed corresponding to screw holes 80 of the data storage device 70 so as to position the data storage device 70 and place the same in the accommodation room 150. The number of the protruding points 142 varies depending on the size of the data storage device 70. Generally, the 3.5-inch hard disk has six screw holes 80 in total, but two screw holes 80 have to be omitted from the six screw holes 80 to form the open recess 146, and the 2.5-inch hard disk has four screw holes 80.

Figure 6:
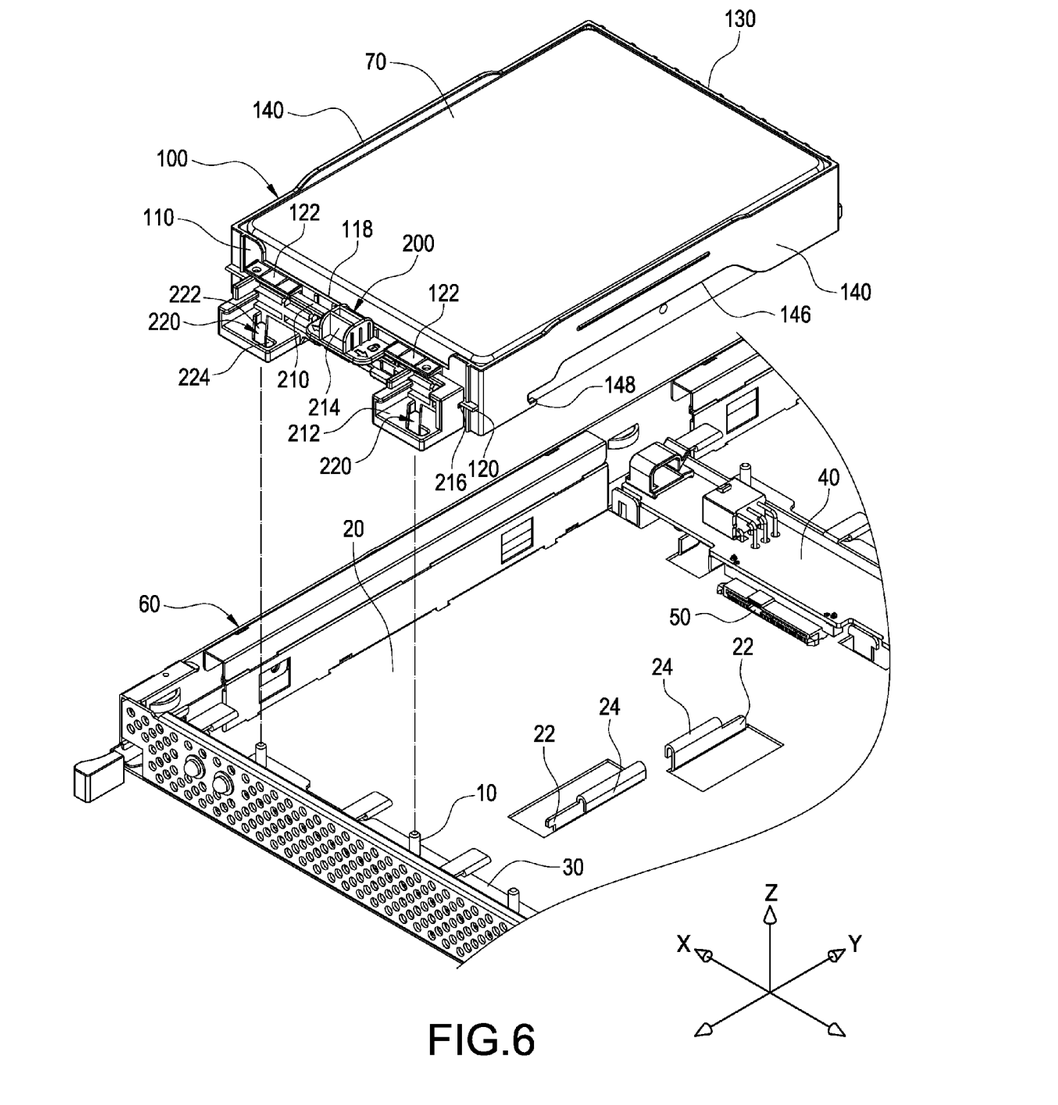
FIG. 6 is an exploded view of the present invention, illustrating the cooperation between the assembly structure and the tray.

Referring to FIG. 6, the tray 60 includes a circuit board 40 and an electrical connector 50 coupled to the circuit board 40. The electrical connector 50 is preferably a SATA connector or any other connector suitable for being coupled to the data storage device 70. The base plate 20 further includes a positioning rib 22 disposed corresponding to the positioning hook 148 and includes a resilient portion 24 bending from the positioning rib 22. The positioning rib 22 or the resilient portion 24 is movable transversely in the open recess 146 to resiliently fix the data storage device 70.

Referring to FIGS. 7 to 10, the transverse movement member 200 further includes a first position E from which the frame 100 is pulled out along the longitudinal direction Y, and includes a second position S from which the frame 100 is pushed back along the longitudinal direction Y (in order to electrically connect/install the data storage device 70). According to the present embodiment, the guiding slot 220 further includes an inclined slot 222 and a transverse slot 224 connected to the inclined slot 222.

Figure 7:
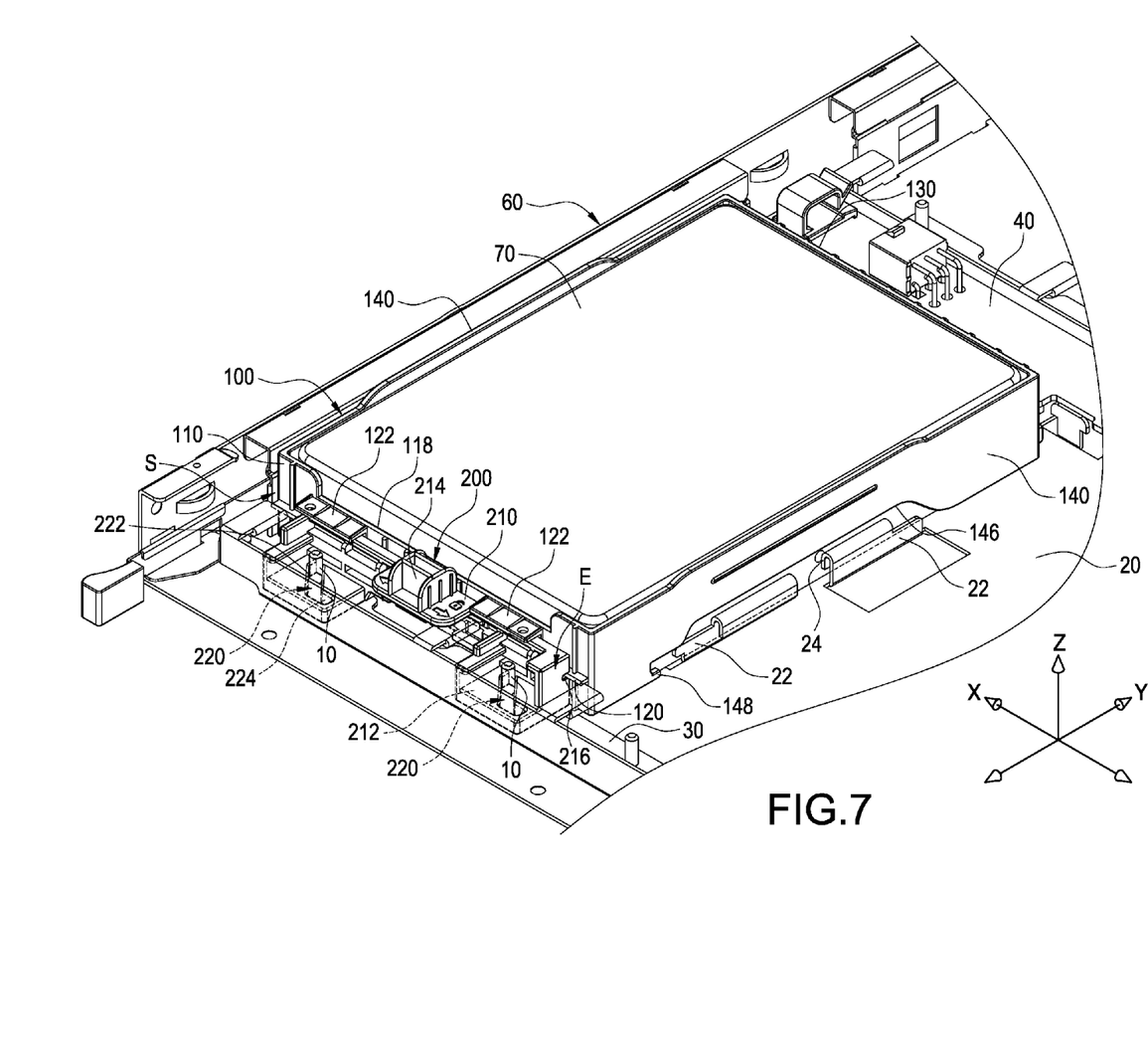
FIG. 7 is an assembled view of FIG. 6, i.e. a perspective view illustrating that a transverse movement member longitudinally pulls out the frame to a first position.
Figure 8:
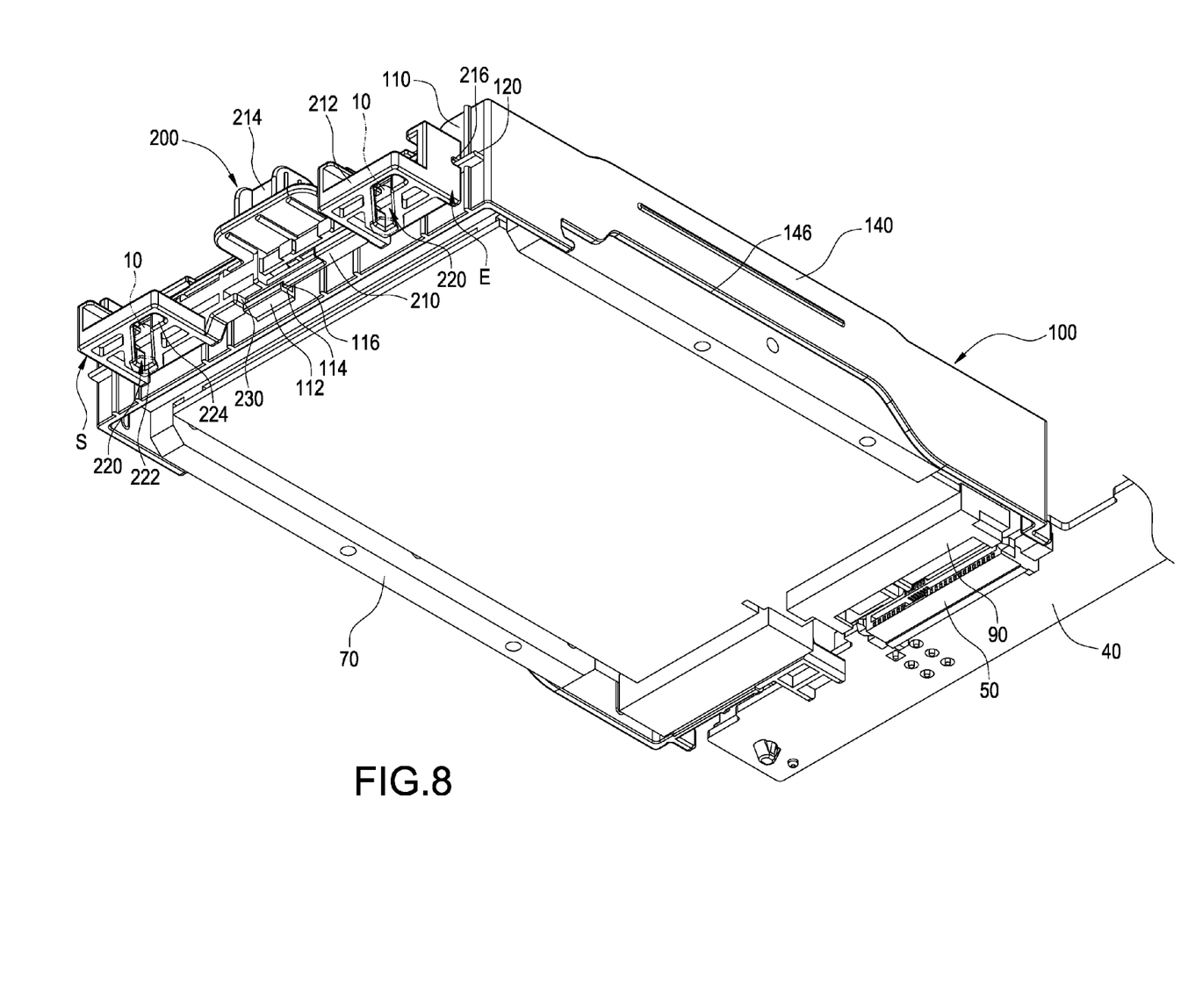
FIG. 8 is another perspective view of FIG. 7, viewed from a different viewing angle.

Referring to FIGS. 7 and 8, when the inclined slot 222 moves toward the first position E with respect to the guiding pillar 10, the restriction recess 230 of the transverse movement member 200 pulls the hook plate 112, so as to enable the frame 100 to be pulled out with respect to the tray 60 along the longitudinal direction Y. At this point, the socket 90 of the data storage device 70 is disconnected from the electrical connector 50 of the circuit board 40, and the positioning hook 148 of the third side plate 140 is separated from the corresponding positioning rib 22. Therefore, the user can easily remove the data storage device 70 from the depression 118 for replacement or maintenance. Further, when the guiding slot 220 moves with respect to the guiding pillar 10 from an end portion of the inclined slot 222 to the transverse slot 224 (i.e. moving toward the first position E), the guiding pillar 10 generates to the inclined slot 222 a component force (not illustrated) along the longitudinal direction Y perpendicular to the transverse direction X, so the restriction recess 230 can pull the hook plate 112 to pull out the frame 100 with respect to the tray 60 along the longitudinal direction Y.

Figure 9:
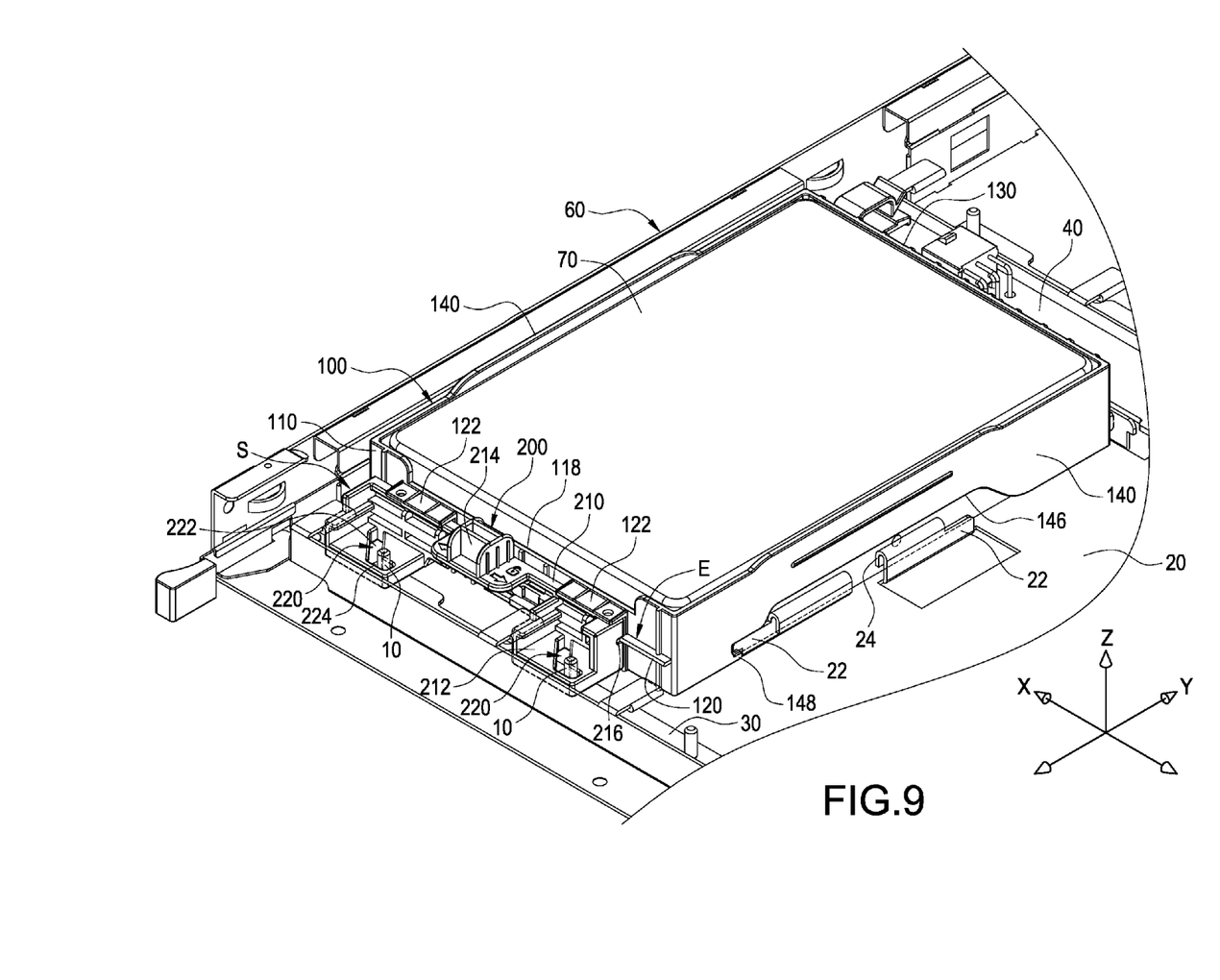
FIG. 9 is a perspective view of the present invention, illustrating that the transverse movement member longitudinally pushes the frame back to a second position.
Figure 10:
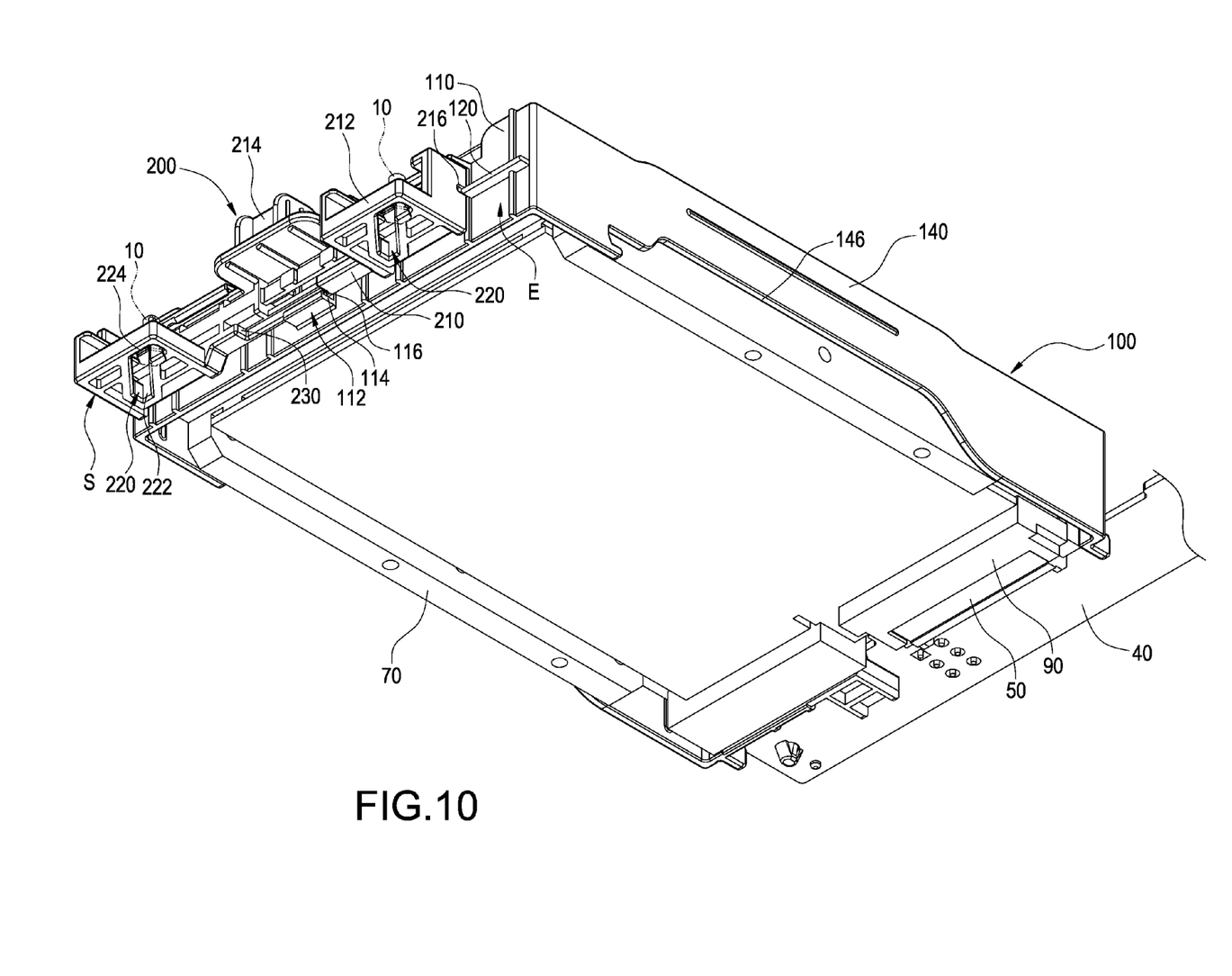
FIG. 10 is another perspective view of FIG. 9, viewed from a different viewing angle

Referring to FIGS. 9 and 10, when the inclined slot 222 moves toward the second position S with respect to the guiding pillar 10, the restriction recess 230 of the transverse movement member 200 pulls the hook plate 112, the frame 100 is pushed back with respect to the tray 60 along the longitudinal direction Y. At this point, the socket 90 of the data storage device 70 is coupled to the electrical connector 50 of the circuit board 40, and the positioning hook 148 of the third side plate 140 contacts and positioned the positioning rib 22. Thus, by operating the transverse movement member 200, the user can easily assemble the storage device 70 on the circuit board 40 of the tray 60 without the use of screws or other fixation elements. Furthermore, when the guiding slot 220 moves with respect to the guiding pillar 10 from the transverse slot 224 to the inclined slot 222 and moves along the inclined slot 222 to the other end of the guiding slot 220 (i.e. moving toward the second position S), the guiding pillar 10 likewise generates to the inclined slot 222 a component force (not illustrated) along the longitudinal direction Y perpendicular to the transverse direction X, so the restriction recess 230 can push the hook plate 112 to push back the frame 100 with respect to the tray 60 along the longitudinal direction Y, whereby connecting the data storage device 70 to the electrical connector 50.

It should be noted that, according to the "resolution of force" principle utilized by the present invention, when moving the transverse movement member 200 in the transverse direction X, the guiding pillar 10 generates to the inclined slot 222 the component force along the longitudinal direction Y perpendicular to the transverse direction X, so the transverse movement member 200 generates the pulling force or pushing force with respect to the guiding pillar 10. Thus, the user only needs to operate the transverse movement member 200 transversely to achieve quick replacement or maintenance of the hard disk. Moreover, by collaboration of the transverse movement member 200 and the frame 100, the present invention has a simple structure and achieves handy operation, reduces the size of the server chassis, and reduces the manpower cost or a waste of other costs.

It is to be understood that the above descriptions are merely preferable embodiments of the present invention and are not intended to limit the scope of the present invention. Equivalent changes and modifications made in the spirit of the present invention are regarded as falling within the scope of the present invention.

What is claimed is:

1. An assembly structure for a data storage device of a server, comprising: a tray having a guiding pillar; a frame disposed on the tray, the frame including a side plate and a hook plate protrudingly disposed on a surface of the side plate; and a transverse movement member connected to the hook plate of the side plate, the transverse movement member including a guiding slot movable with respect to the guiding pillar and moving the frame in a longitudinal direction, the transverse movement member also including a restriction recess restricting the hook plate from moving transversely; wherein the frame further includes a second side plate corresponding to the side plate, two third side plates connected to the side plate and the second side plate, and an accommodation room surrounded by the side plate, the second side plate, and the two third side plates; and wherein the transverse movement member further includes a body, an extension portion forming the guiding slot, an actuation portion, and an auxiliary recess; the actuation portion is disposed on an upper surface of the body; the extension portion extends outwardly from the body away from the hook plate; the side plate further includes an auxiliary plate disposed corresponding to the auxiliary recess and includes a restriction plate restricting the body from moving in a vertical direction.

2. The assembly structure of claim 1, wherein the side plate further includes a depression, the second side plate includes an assembly hole, the tray includes a circuit board and an electrical connector coupled to the circuit board, and the electrical connector is disposed corresponding to the assembly hole.

3. The assembly structure of claim 1, wherein the two third side plates further include a plurality of protruding points, an open recess, and a positioning hook disposed at one side of the open recess, and the protruding points are disposed on an inner surface of the two third side plates.

4. The assembly structure of claim 3, wherein the tray further includes a base plate and a reinforcement plate disposed on the base plate, the guiding pillar is selectively fixed on the base plate or the reinforcement plate, the base plate further includes a positioning rib disposed corresponding to the positioning hook and includes a resilient portion bending from the positioning rib, and the positioning rib or the resilient portion is movable transversely in the open recess.

5. The assembly structure of claim 1, wherein the auxiliary plate, the restriction plate, and the hook plate are disposed parallel to one another, and the auxiliary plate is disposed between the hook plate and the restriction plate.

6. The assembly structure of claim 1, wherein the restriction recess is formed at an opposite side of the body with respect to the actuation portion, the hook plate includes a flat plate and a hook portion disposed at one end of the flat plate, and the hook portion capable of hooking a wall of the restriction recess.

7. The assembly structure of claim 1, wherein the transverse movement member further includes a first position from which the frame is pulled out longitudinally, and includes a second position from which the frame is longitudinally pushed back.

8. The assembly structure of claim 7, wherein the guiding slot further includes an inclined slot and a transverse slot connected to the inclined slot; when the inclined slot moves toward the first position with respect to the guiding pillar, the restriction recess of the transverse movement member pulls the hook plate, so as to enable the frame to move longitudinally with respect to the tray; when the inclined slot moves toward the second position with respect to the guiding pillar, the restriction recess of the transverse movement member pushes the hook plate so as to enable the frame to move longitudinally with respect to the tray.

* * * * *